(12) United States Patent
Muramatsu et al.

(10) Patent No.: US 10,283,551 B2
(45) Date of Patent: May 7, 2019

(54) BACK-ILLUMINATED SOLID-STATE IMAGING ELEMENT

(71) Applicant: HAMAMATSU PHOTONICS K.K., Hamamatsu-shi, Shizuoka (JP)

(72) Inventors: Masaharu Muramatsu, Hamamatsu (JP); Hisanori Suzuki, Hamamatsu (JP); Yasuhito Yoneta, Hamamatsu (JP); Shinya Otsuka, Hamamatsu (JP); Hirotaka Takahashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/764,492

(22) PCT Filed: Jul. 11, 2016

(86) PCT No.: PCT/JP2016/070425
§ 371 (c)(1),
(2) Date: Mar. 29, 2018

(87) PCT Pub. No.: WO2017/056629
PCT Pub. Date: Apr. 6, 2017

(65) Prior Publication Data
US 2018/0286901 A1    Oct. 4, 2018

(30) Foreign Application Priority Data

Sep. 30, 2015  (JP) .................................. 2015-192975

(51) Int. Cl.
*H01L 27/146* (2006.01)
*H01L 31/02* (2006.01)
*H04N 5/369* (2011.01)

(52) U.S. Cl.
CPC ........ *H01L 27/1464* (2013.01); *H01L 27/146* (2013.01); *H01L 27/1462* (2013.01); *H01L 31/02* (2013.01); *H04N 5/369* (2013.01)

(58) Field of Classification Search
CPC ............................ H01L 27/1462; H01L 31/02
See application file for complete search history.

(56) References Cited

U.S. PATENT DOCUMENTS

2007/0007556 A1* 1/2007 Shibayama ....... H01L 27/14618
257/228
2013/0264481 A1* 10/2013 Chern ................. H01L 31/0216
250/358.1
2014/0291493 A1* 10/2014 Chuang ................ H01L 31/103
250/216

FOREIGN PATENT DOCUMENTS

JP    2000-133802 A    5/2000
JP    2000-138365 A    5/2000
(Continued)

OTHER PUBLICATIONS

International Preliminary Report on Patentability dated Apr. 12, 2018 for PCT/JP2016/070425.

*Primary Examiner* — Kenneth Parker
*Assistant Examiner* — Long H Le
(74) *Attorney, Agent, or Firm* — Drinker Biddle & Reath LLP

(57) ABSTRACT

A back-illuminated solid-state imaging element includes a semiconductor substrate which has a front surface and a back surface provided with a recess, and in which a thinned section, which is a bottom section of the recess, is an imaging area, a signal read-out circuit formed on the front surface of the semiconductor substrate, a boron layer formed on at least the back surface of the semiconductor substrate and a lateral surface of the recess, a metal layer formed on the boron layer, and provided with an opening opposing a (Continued)

bottom surface of the recess, and an anti-reflection layer formed on the bottom surface of the recess.

5 Claims, 8 Drawing Sheets

(56) References Cited

FOREIGN PATENT DOCUMENTS

| | | |
|---|---|---|
| JP | 2002-231913 A | 8/2002 |
| JP | 2004-31452 A | 1/2004 |

* cited by examiner (a)

(b)

(c)

(a)

(b)

(a)

(b)

(a)

(b)

BACK-ILLUMINATED SOLID-STATE IMAGING ELEMENT

TECHNICAL FIELD

The present disclosure relates to a back-illuminated solid-state imaging element.

BACKGROUND ART

There is a back-illuminated solid-state imaging element in which a recess is provided on the back surface of a semiconductor substrate having a signal read-out circuit formed on the front surface thereof, and a thinned section which is the bottom section of the recess is used as an imaging area. In such a back-illuminated solid-state imaging element, from the viewpoint of prevention of degradation of resolution, incidence of light on a frame portion surrounding the thinned section may be prevented in some cases. For example, in a semiconductor device described in Patent Literature 1, in order to prevent incidence of energy rays on a bevel portion (the portion between the thinned section and the frame portion), a shielding layer made of black resin is formed on an inclined surface defining the bevel portion (the lateral surface of the recess).

CITATION LIST

Patent Literature

[Patent Literature 1] Japanese Unexamined Patent Publication No. 2002-231913

SUMMARY OF INVENTION

Technical Problem

However, in the semiconductor device described in Patent Literature 1, since the shielding layer is made of black resin, the shielding layer may deteriorate in a relatively short period of time.

Thus, an object of an aspect of the present disclosure is to provide a back-illuminated solid-state imaging element capable of preventing incidence of light on a frame portion surrounding a thinned section in a semiconductor substrate over a long period of time.

Solution to Problem

A back-illuminated solid-state imaging element according to an aspect of the present disclosure includes a semiconductor substrate which has a front surface and a back surface provided with a recess, and in which a thinned section which is a bottom section of the recess is an imaging area, a signal read-out circuit formed on the front surface of the semiconductor substrate, a boron layer formed on at least the back surface of the semiconductor substrate and a lateral surface of the recess, a metal layer formed on the boron layer, and provided with an opening opposing a bottom surface of the recess, and an anti-reflection layer formed on the bottom surface of the recess.

In the back-illuminated solid-state imaging element, the metal layer is formed on the back surface of the semiconductor substrate and the lateral surface of the recess with the boron layer interposed therebetween. This configuration is based on the findings found by the present inventors that the metal layer is stably formed on the boron layer. Therefore, the incidence of light on the frame portion surrounding the thinned section in the semiconductor substrate is prevented by the stably formed metal layer. Therefore, according to the back-illuminated solid-state imaging element, it is possible to prevent the incidence of light on the frame portion surrounding the thinned section in the semiconductor substrate over a long period of time.

In the back-illuminated solid-state imaging element according to the aspect of the present disclosure, the recess may have a frustum shape spreading toward a side opposite to the front surface side of the semiconductor substrate. According to the configuration, the stability of the metal layer formed on the lateral surface of the recess with the boron layer interposed therebetween can be further improved.

In the back-illuminated solid-state imaging element according to the aspect of the present disclosure, the boron layer may further be formed on the bottom surface of the recess, and the anti-reflection layer may be formed on the bottom surface of the recess with the boron layer interposed therebetween. According to the configuration, resistance to extreme ultraviolet rays can be improved, and the boron layer can function as an accumulation layer.

In the back-illuminated solid-state imaging element according to the aspect of the present disclosure, at least a region surrounding the recess in the semiconductor substrate may be made of a P type semiconductor material. According to the configuration, since the metal layer is electrically connected to the P type region through the boron layer, it is possible to reduce the resistance of the region.

In the back-illuminated solid-state imaging element according to the aspect of the present disclosure, the metal layer may be a plating layer. This configuration is based on the findings found by the present inventors that the metal layer is selectively and isotropically formed on the boron layer by plating. By forming the boron layer on the lateral surface of the recess, it is possible to reliably form the metal layer on the lateral surface of the recess with the boron layer interposed therebetween, without being influenced by the shape of the recess or the like. Thus, the stability of the metal layer formed on the lateral surface of the recess with the boron layer interposed therebetween can be further improved.

Advantageous Effects of Invention

According to an aspect of the present disclosure, it is possible to provide a back-illuminated solid-state imaging element capable of preventing incidence of light on the frame portion surrounding the thinned section in the semiconductor substrate over a long period of time.

DESCRIPTION OF EMBODIMENTS

Figure 1:
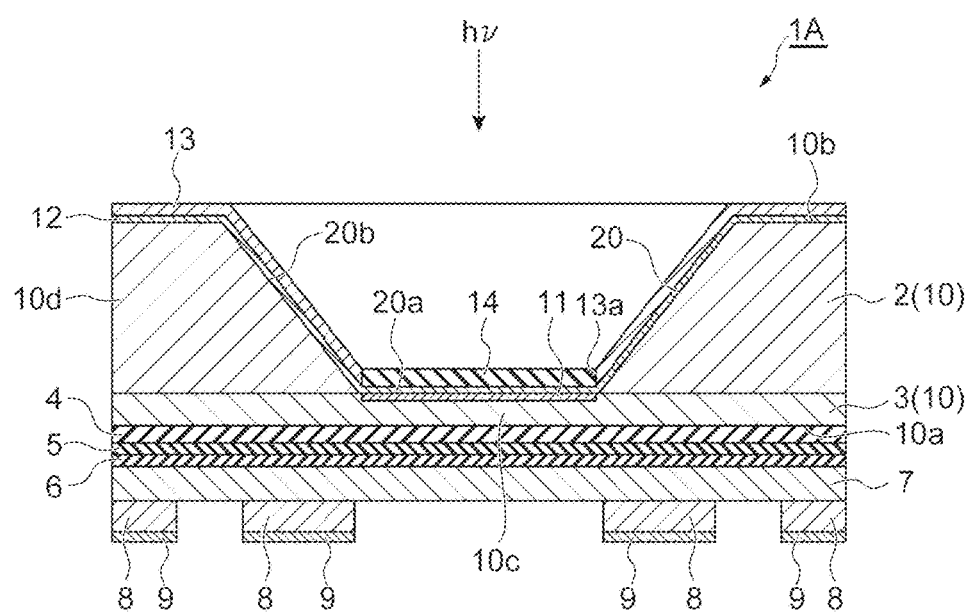
FIG. 1 is a cross-sectional view of a back-illuminated solid-state imaging element of a first embodiment of the present disclosure.

Hereinafter, embodiments of the present disclosure will be described in detail with reference to the accompanying drawings. In addition, in the drawings, the same or corresponding parts are denoted by the same reference numerals, and a redundant description is omitted.

[First Embodiment]

A back-illuminated solid-state imaging element 1A shown in FIG. 1 is a back-illuminated charge coupled device (CCD) image sensor. As shown in FIG. 1, the back-illuminated solid-state imaging element 1A is provided with a semiconductor substrate 10. The semiconductor substrate 10 is formed by epitaxially growing a P⁻ type semiconductor layer 3 on the front surface of a P⁺ type semiconductor substrate 2. The P⁺ type semiconductor substrate 2 and the P⁻ type semiconductor layer 3 are made of, for example, silicon crystal. Further, "P⁺ type" means that the concentration of the P type impurity is as high as, for example, about $1\times10^{17}$ cm$^{-3}$ or more, and "P⁻ type" means that the concentration of the P type impurity is as low as, for example, about $1\times10^{15}$ cm$^{-3}$ or less.

Gate insulating films 4, 5, 6 are formed on the front surface 10a of the semiconductor substrate 10. The gate insulating films 4, 6 are, for example, silicon oxide films, and the gate insulating film 5 is, for example, silicon nitride film. That is, the gate insulating films 4, 5, and 6 have an oxide film-nitride film-oxide film (ONO) structure. A signal read-out circuit 7 is formed on the gate insulating films 4, 5, and 6. That is, the signal read-out circuit 7 is formed on the front surface 10a of the semiconductor substrate 10 with the gate insulating films 4, 5, and 6 interposed therebetween. The signal read-out circuit 7 includes a plurality of charge transfer electrodes. A metal wiring 8 for signal input and output for the signal read-out circuit 7 is formed on the signal read-out circuit 7. The metal wiring 8 is made of, for example, aluminum. An under bump metal (UBM) 9 for forming a solder bump is formed on the metal wiring 8.

A recess 20 is provided on the back surface 10b of the semiconductor substrate 10. The recess 20 has a frustum shape (for example, quadrangular frustum shape) spreading toward a side opposite to the front surface 10a side of the semiconductor substrate 10. The bottom surface 20a of the recess 20 reaches the interface between the P⁺ type semiconductor substrate 2 and the P⁻ type semiconductor layer 3. In the semiconductor substrate 10, the thinned section 10c, which is the bottom section of the recess 20, is defined as the imaging area, and a portion surrounding the thinned section 10c is defined as the frame portion 10d when viewed from the thickness direction of the semiconductor substrate 10. In the semiconductor substrate 10, a region surrounding at least the recess 20 when viewed from the thickness direction of the semiconductor substrate 10 is made of a material of the P⁺ type semiconductor substrate 2 (P type semiconductor material). It should be noted that the thinned section 10c means a portion thinned in the thickness direction of the semiconductor substrate 10 as compared with the frame portion 10d.

An accumulation layer 11 for eliminating a backside well is formed in a part of the P⁻ type semiconductor layer 3 corresponding to the bottom surface 20a of the recess 20. The accumulation layer 11 is formed by ion implanting or diffusing a P type impurity into the part of the P⁻ type semiconductor layer 3 corresponding to the bottom surface 20a of the recess 20. In the semiconductor substrate 10, a region from the accumulation layer 11 to the front surface 10a of the semiconductor substrate 10 in the P⁻ type semiconductor layer 3 functions as a photoelectric conversion region. Although not shown in the drawing, an N-type buried channel opposing each charge transfer electrode of the signal read-out circuit 7, an n-type accumulation portion for accumulating electrons generated in the photoelectric conversion region, or the like are formed in the portion of the photoelectric conversion region on the front surface 10a side.

A boron layer 12 is formed in a series on the back surface 10b of the semiconductor substrate 10, the lateral surface 20b of the recess 20, and the bottom surface 20a of the recess 20. The boron layer 12 is formed isotropically with a thickness of several nm to several tens of nm by, for example, chemical vapor deposition (CVD) epitaxial growth. A metal layer 13 is formed on the boron layer 12. The metal layer 13 is provided with an opening 13a opposing the bottom surface 20a of the recess 20. That is, the metal layer 13 is formed on the back surface 10b of the semiconductor substrate 10 and the lateral surface 20b of the recess 20 with the boron layer 12 interposed therebetween. The metal layer 13 functions as a light shielding layer for the light hv. When viewed from the thickness direction of the semiconductor substrate 10, the shape of the opening 13a coincides with the shape of the bottom surface 20a of the recess 20.

The metal layer 13 is isotropically formed on the boron layer 12 with a thickness of several µm to several tens µm by, for example, plating. An example of plating is electroless metal plating. In this case, the metal layer 13 is a plating layer. For example, the plating layer is configured by forming a surface layer with a thickness of about 0.05 µm made of gold on an underlayer with a thickness of about 10 µm made of nickel by electroless Ni/Au plating. The findings found by the present inventors are that the metal layer 13 is stably formed on the boron layer 12, and the metal layer 13 is selectively and isotropically formed on the boron layer 12 by plating.

On the bottom surface 20a of the recess 20, an anti-reflection layer 14 is formed with the boron layer 12 interposed therebetween. The anti-reflection layer 14 is disposed inside the opening 13a of the metal layer 13. The anti-reflection layer 14 is made of, for example, aluminum oxide.

Figure 2:
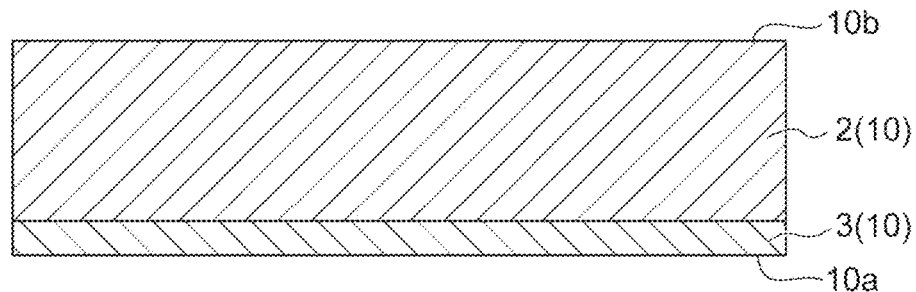
FIGS. 2(a), (b) and (c) are cross-sectional views for explaining a manufacturing method of the back-illuminated solid-state imaging element of FIG. 1.
Figure 2:
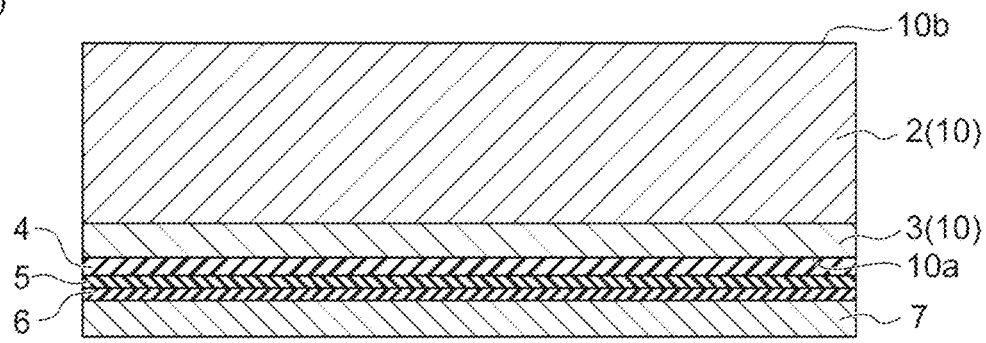
Figure 2:
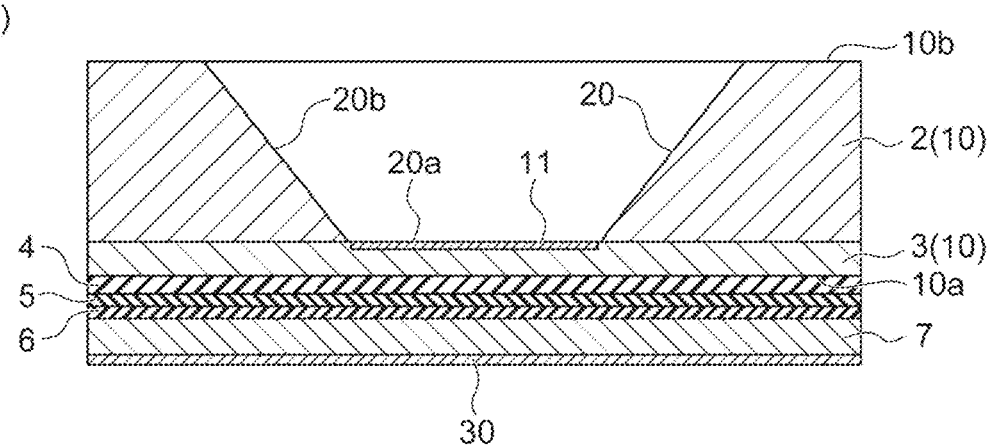

Next, a manufacturing method of the back-illuminated solid-state imaging element 1A will be described. First, as shown in FIG. 2(a), a semiconductor substrate 10 is obtained by epitaxially growing a P⁻ type semiconductor layer 3 on the front surface of a P⁺ type semiconductor substrate 2. Subsequently, as shown in FIG. 2(b), gate insulating films 4, 5 and 6 are formed on the front surface 10a of the semiconductor substrate 10, and a signal read-out circuit 7 is formed on the gate insulating films 4, 5 and 6. Subsequently, as shown in FIG. 2(c), a recess 20 is formed on the back surface 10b of the semiconductor substrate 10 by anisotropic etching such as alkali etching, and an accumulation layer 11 is formed by ion implanting or diffusing a P type impurity into the part of the P⁻ type semiconductor layer 3 corresponding to the bottom surface 20a of the recess 20. Then, a protective film 30 is formed on the signal read-out circuit 7.

Figure 3:
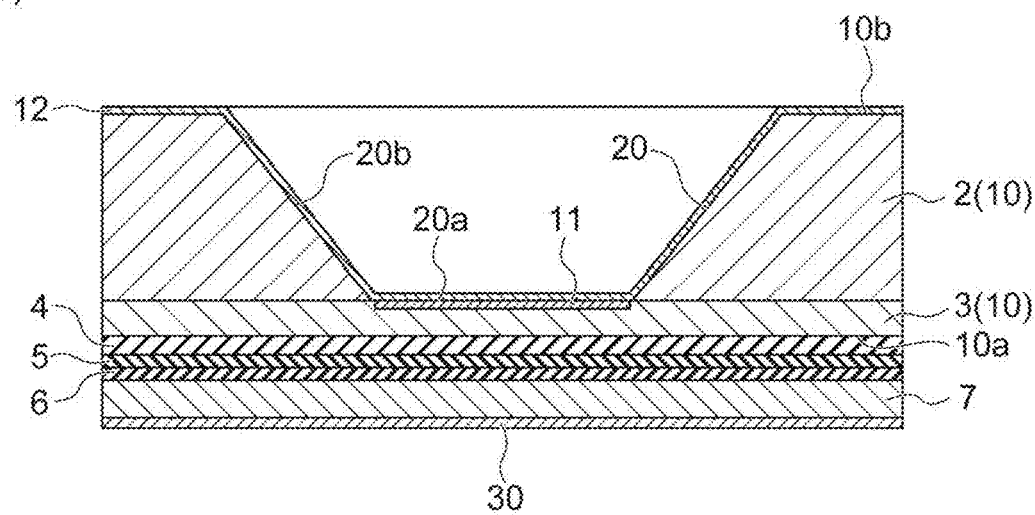
FIGS. 3(a) and (b) are cross-sectional views for explaining the manufacturing method of the back-illuminated solid-state imaging element of FIG. 1.
Figure 3:
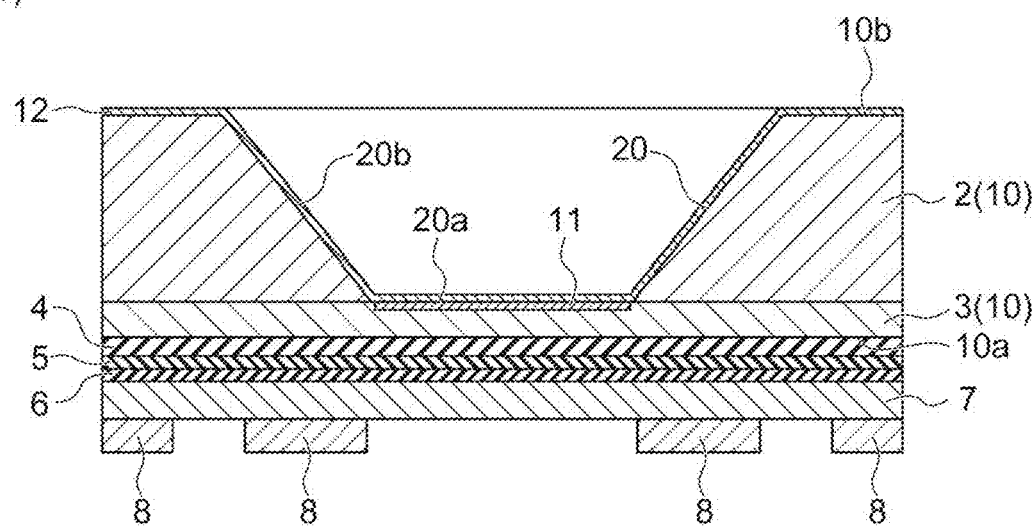
Figure 4:
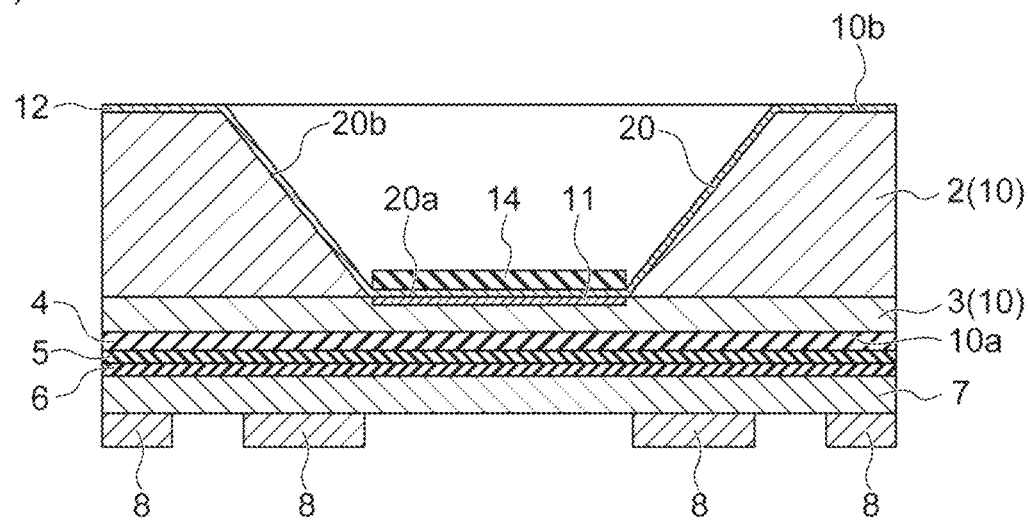
FIGS. 4(a) and (b) are cross-sectional views for explaining the manufacturing method of the back-illuminated solid-state imaging element of FIG. 1.
Figure 4:
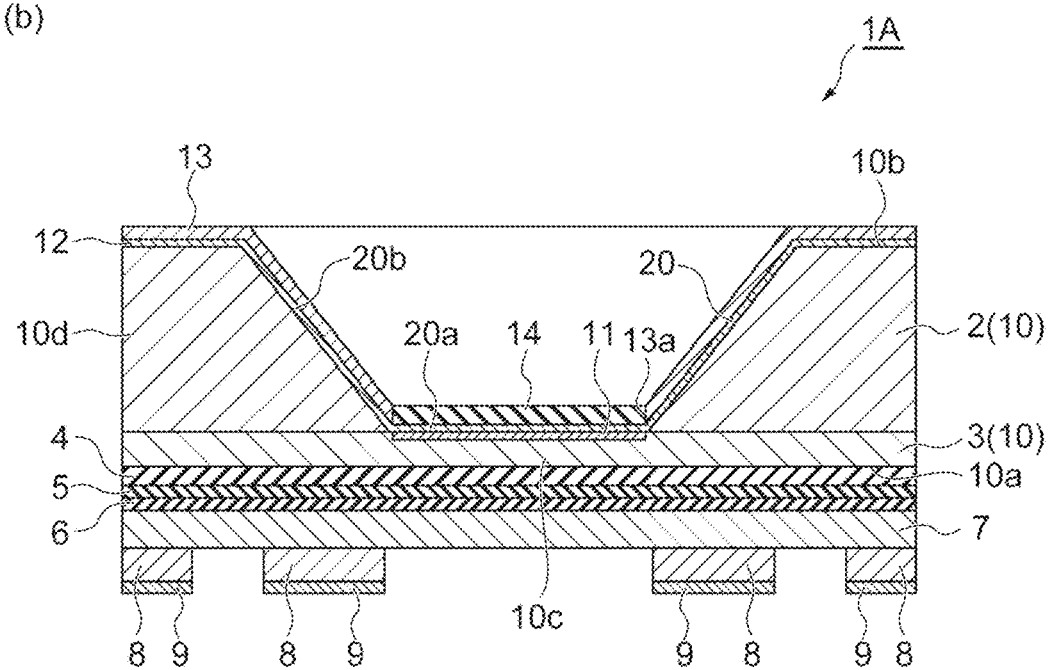

Subsequently, as shown in FIG. 3(a), after removing a native oxide film, the boron layer 12 isotropically formed on the back surface 10b of the semiconductor substrate 10, the lateral surface 20b of the recess 20, and the bottom surface 20a of the recess 20, by CVD epitaxial growth. Subsequently, as shown in FIG. 3(b), a metal wiring 8 is formed on the signal read-out circuit 7 after removing the protective film 30. Subsequently, as shown in FIG. 4(a), by sequentially performing atomic layer deposition (ALD) and patterning by etching, an anti-reflection layer 14 is formed on the bottom surface 20a of the recess 20 with the boron layer 12 interposed therebetween. Subsequently, as shown in FIG. 4(b), a metal layer 13 is selectively and isotropically formed on the boron layer 12 by plating. Finally, an UBM 9 is formed on the metal wiring 8 to obtain a back-illuminated solid-state imaging element 1A.

It has been difficult to uniformly form a metal layer with a desired thickness on the lateral surface 20b of the recess 20 by using a vapor phase growth method. Therefore, a resin layer may be formed as a light shielding layer in some cases. However, in the resin layer, problems occur such as deterioration in a relatively short period of time and occurrence of outgassing. According to the manufacturing method of the back-illuminated solid-state imaging element 1A described above, it is possible to uniformly form the metal layer 13 with a desired thickness on the lateral surface 20b of the recess 20, without being influenced by the shape of the recess or the like.

As described above, in the back-illuminated solid-state imaging element 1A, the metal layer 13 is formed on the back surface 10b of the semiconductor substrate 10 and the lateral surface 20b of the recess 20 with the boron layer 12 interposed therebetween. This configuration is based on the findings found by the present inventors that the metal layer 13 is stably formed on the boron layer 12. Therefore, the light by traveling into the recess 20 from the back surface 10b side of the semiconductor substrate 10 penetrates through the anti-reflection layer 14 and efficiently enters the thinned section 10c of the semiconductor substrate 10. On the other hand, the incidence of the light by to the frame portion 10d of the semiconductor substrate 10 is prevented by the stably formed metal layer 13. Therefore, according to the back-illuminated solid-state imaging element 1A, it is possible to prevent the incidence of the light hv from being incident on the frame portion 10d of the semiconductor substrate 10 over a long period of time.

In the back-illuminated solid-state imaging element 1A, since the metal layer 13 is formed as a light shielding layer, it is possible to prevent the problem of outgassing occurring in a case where a resin layer is formed as the light shielding layer.

In the back-illuminated solid-state imaging element 1A, the recess 20 has a frustum shape spreading toward the side opposite to the front surface 10a side of the semiconductor substrate 10. With this configuration, the stability of the metal layer 13 formed on the lateral surface 20b of the recess 20 with the boron layer 12 interposed therebetween can be further improved.

Further, in the back-illuminated solid-state imaging element 1A, the boron layer 12 is formed on the bottom surface 20a of the recess 20 and the anti-reflection layer 14 is formed on the bottom surface 20a of the recess 20 with the boron layer 12 interposed therebetween. With this configuration, resistance to extreme ultraviolet rays can be improved, and the boron layer 12 can function as an accumulation layer.

In the back-illuminated solid-state imaging element 1A, a region surrounding the recess 20 in the semiconductor substrate 10 may be made of a P type semiconductor material. According to the configuration, since the metal layer 13 is electrically connected to the P type region through the boron layer 12, it is possible to reduce the resistance of the region. Therefore, by grounding for example, the metal layer 13, the holes generated in the thinned section 10c of the semiconductor substrate 10 by photoelectric conversion are promptly moved to the metal layer 13 through the frame portion 10d of the semiconductor substrate 10, and it becomes possible to stably sweep out the holes to the ground.

Further, in the back-illuminated solid-state imaging element 1A, the metal layer 13 is a plating layer. This configuration is based on the findings found by the present inventors that the metal layer 13 is selectively and isotropically formed on the boron layer 12 by plating. By forming the boron layer 12 on the lateral surface 20b of the recess 20, the metal layer 13 can be reliably formed on the lateral surface 20b of the recess 20 with the boron layer 12 interposed therebetween, without being influenced by the shape of the recess 20 or the like. Therefore, the stability of the metal layer 13 formed on the lateral surface 20b of the recess 20 with the boron layer 12 interposed therebetween can be further improved.

[Second Embodiment]

Figure 5:
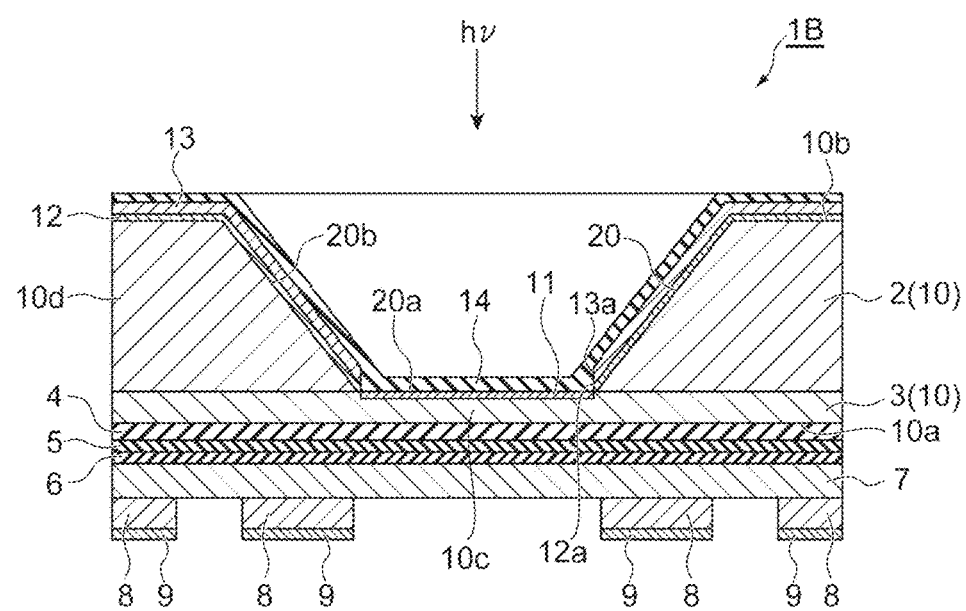
FIG. 5 is a cross-sectional view of a back-illuminated solid-state imaging element of a second embodiment of the present disclosure.

As shown in FIG. 5, the back-illuminated solid-state imaging element 1B is mainly different from the back-illuminated solid-state imaging element 1A in the configurations of the boron layer 12 and the anti-reflection layer 14. In the back-illuminated solid-state imaging element 1B, the boron layer 12 is formed in a series on the back surface 10b of the semiconductor substrate 10 and the lateral surface 20b of the recess 20, but is not formed on the bottom surface 20a of the recess 20. The boron layer 12 is provided with an opening 12a opposing the bottom surface 20a of the recess 20. It is the same as the above-described back-illuminated solid-state imaging element 1A in that the metal layer 13 is formed on the back surface 10b of the semiconductor substrate 10 and the lateral surface 20b of the recess 20 with the boron layer 12 interposed therebetween. When viewed from the thickness direction of the semiconductor substrate 10, the shape of each of the openings 12a and 13a coincides with the shape of the bottom surface 20a of the recess 20. The anti-reflection layer 14 is formed in a series on the bottom surface 20a of the recess 20 and the metal layer 13. A part of the anti-reflection layer 14 is disposed inside the openings 12a and 13a.

Figure 6:
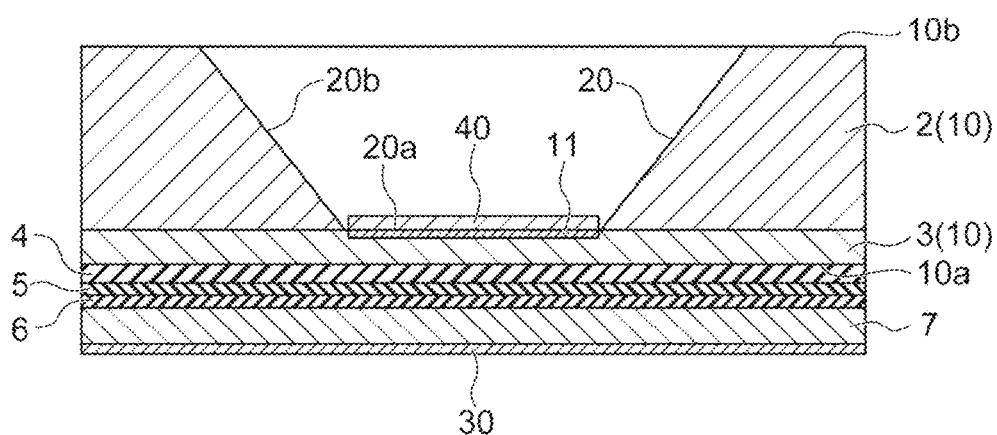
FIGS. 6(a) and (b) are cross-sectional views for explaining the manufacturing method of the back-illuminated solid-state imaging element of FIG. 5.
Figure 6:
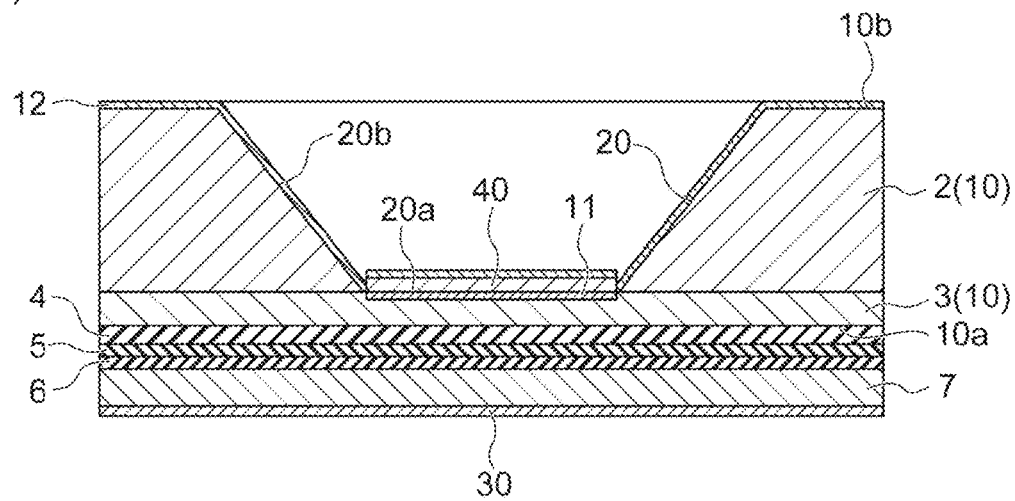

Next, a manufacturing method of the back-illuminated solid-state imaging element 1B will be described. The process up to framing the protective film 30 on the signal read-out circuit 7 is similar to the manufacturing method of the back-illuminated solid-state imaging element 1A described above (see FIGS. 2(a), (b) and (c)). Subsequently, as shown in FIG. 6(a), a lift-off resist film 40 is formed on the bottom surface 20a of the recess 20 by sequentially applying resist and patterning by etching. Subsequently, as shown in FIG. 6(b), after removing a native oxide film, the boron layer 12 isotropically formed on the back surface 10b of the semiconductor substrate 10, the lateral surface 20b of the recess 20, and the lift-off resist film 40, by CVD epitaxial growth.

Figure 7:
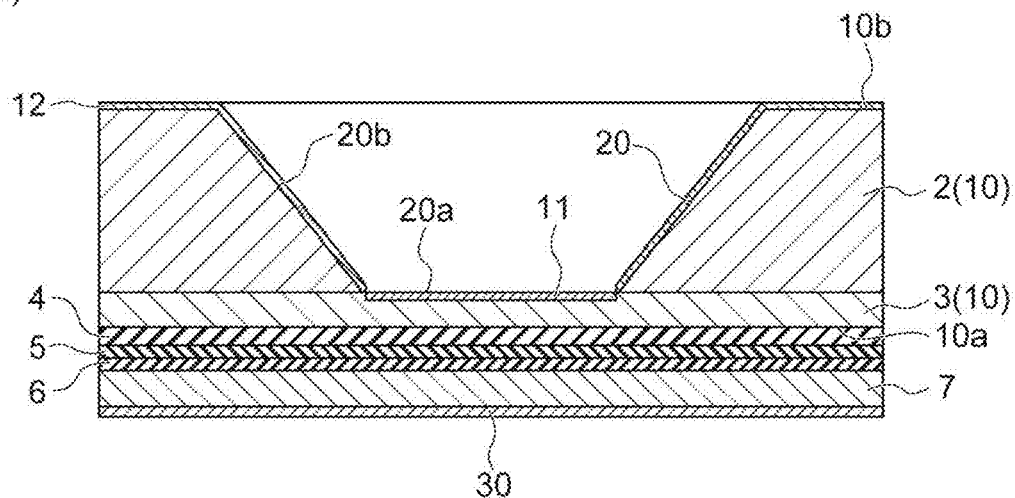
FIGS. 7(a) and (b) are cross-sectional views for explaining the manufacturing method of the back-illuminated solid-state imaging element of FIG. 2.
Figure 7:
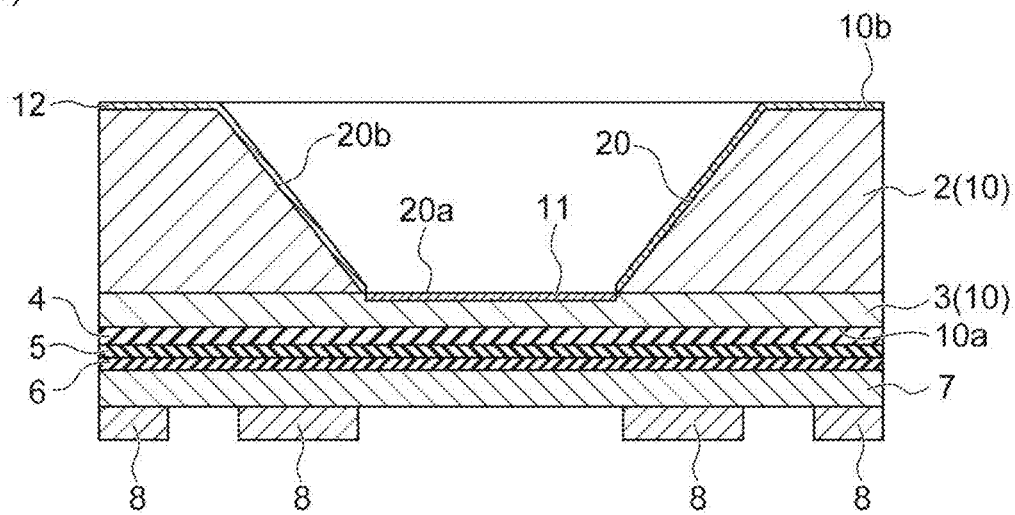
Figure 8:
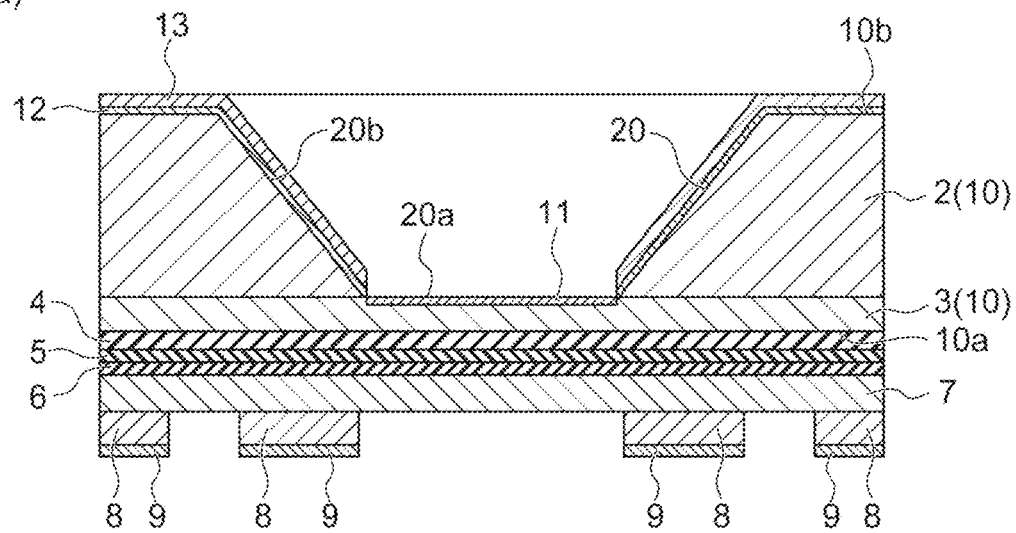
FIGS. 8(a) and (b) are cross-sectional views for explaining the manufacturing method of the back-illuminated solid-state imaging element of FIG. 5.
Figure 8:
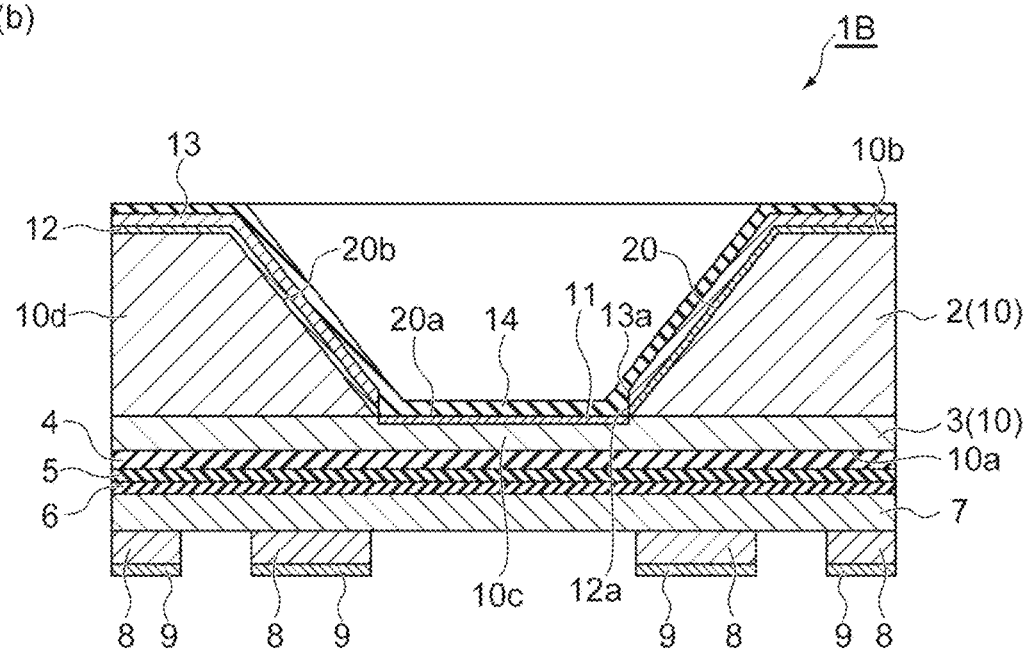

Subsequently, as shown in FIG. 7(a), the boron layer 12 formed on the lift-off resist film 40 is removed together with the lift-off resist film 40. Subsequently, as shown in FIG. 7(b), a metal wiring 8 is formed on the signal read-out circuit 7 after removing the protective film 30. Subsequently, as shown in FIG. 8(a), a metal layer 13 is selectively and isotropically formed on the boron layer 12 by plating. Further, the UBM 9 is formed on the metal wiring 8. Finally, as shown in FIG. 8(b), an anti-reflection layer 14 is formed on the bottom surface 20a of the recess 20 and the metal layer 13 by an atomic layer deposition method to obtain the back-illuminated solid-state imaging element 1B.

As described above, in the back-illuminated solid-state imaging element 1B, the metal layer 13 is formed on the back surface 10b of the semiconductor substrate 10 and the lateral surface 20b of the recess 20 with the boron layer 12 interposed therebetween. Therefore, according to the back-illuminated solid-state imaging element 1B, it is possible to prevent the incidence of the light hv from being incident on the frame portion 10d of the semiconductor substrate 10 over a long period of time, similarly to the above-described back-illuminated solid-state imaging element 1A.

In the back-illuminated solid-state imaging element 1B, since the metal layer 13 is formed as a light shielding layer, it is possible to prevent the problem of outgassing occurring in a case where a resin layer is formed as the light shielding layer.

In the back-illuminated solid-state imaging element 1B, the recess 20 has a frustum shape spreading toward the side opposite to the front surface 10a side of the semiconductor substrate 10. With this configuration, the stability of the metal layer 13 formed on the lateral surface 20b of the recess 20 with the boron layer 12 interposed therebetween can be further improved.

In the back-illuminated solid-state imaging element 1B, a region surrounding the recess 20 in the semiconductor substrate 10 may be made of a P type semiconductor material. According to the configuration, since the metal layer 13 is electrically connected to the P type region through the boron layer 12, it is possible to reduce the resistance of the region. Therefore, by grounding for example, the metal layer 13, the holes generated in the thinned section 10c of the semiconductor substrate 10 by photoelectric conversion are promptly moved to the metal layer 13 through the frame portion 10d of the semiconductor substrate 10, and it becomes possible to stably sweep out the holes to the ground.

Further, in the back-illuminated solid-state imaging element 1B, the metal layer 13 is a plating layer. Therefore, the stability of the metal layer 13 formed on the lateral surface 20b of the recess 20 with the boron layer 12 interposed therebetween can be further improved, similarly to the above-described back-illuminated solid-state imaging element 1A.

Although the first embodiment and the second embodiment of the present disclosure have been described above, an aspect of the present disclosure is not limited to each of the above embodiments. For example, in each of the above embodiments, the conductivity types of the P type and N-type may be exchanged so as to be reversed. The metal layer 13 needs to be formed directly on the boron layer 12, but in other structures, the other structure may be directly formed on the structure to be formed, or may be indirectly formed on the structure to be formed with a certain layer or the like interposed therebetween. Further, each of the above-described embodiments is a case where the back-illuminated solid-state imaging elements 1A and 1B are back-illuminated CCD image sensors. However, an aspect of the present disclosure can also be applied to other back-illuminated solid-state imaging elements such as a back-illuminated CMOS image sensor. In a case where the back-illuminated solid-state imaging element is a back-illuminated CMOS image sensor, a signal read-out circuit including a transistor circuit, a wiring layer or the like is formed on the front surface of the semiconductor substrate.

REFERENCE SIGNS LIST 1A, 1B . . . back-illuminated solid-state imaging element, 7 . . . signal read-out circuit, 10 . . . semiconductor substrate, 10a . . . front surface, 10b . . . back surface, 10c . . . thinned section, 12 . . . boron layer, 13 . . . metal layer, 13a . . . opening, 14 . . . anti-reflection layer, 20 . . . recess, 20a . . . bottom surface, 20b . . . lateral surface.

The invention claimed is:

1. A back-illuminated solid-state imaging element comprising:
   a semiconductor substrate which has a front surface and a back surface provided with a recess, and in which a thinned section which is a bottom section of the recess is an imaging area;
   a signal read-out circuit formed on the front surface of the semiconductor substrate;
   a boron layer formed on at least the back surface of the semiconductor substrate and a lateral surface of the recess;
   a metal layer formed on the boron layer, and provided with an opening opposing a bottom surface of the recess; and
   an anti-reflection layer formed on the bottom surface of the recess.

2. The back-illuminated solid-state imaging element according to claim 1,
   wherein the recess has a frustum shape spreading toward a side opposite to the front surface side of the semiconductor substrate.

3. The back-illuminated solid-state imaging element according to claim 1,
   wherein the boron layer is further formed on the bottom surface of the recess, and
   wherein the anti-reflection layer is formed on the bottom surface of the recess with the boron layer interposed therebetween.

4. The back-illuminated solid-state imaging element according to claim 1,
   wherein at least a region surrounding the recess in the semiconductor substrate is made of a P type semiconductor material.

5. The back-illuminated solid-state imaging element according to claim 1,
   wherein the metal layer is a plating layer.

* * * * *